(12) United States Patent
Yasuda et al.

(10) Patent No.: US 10,916,490 B2
(45) Date of Patent: Feb. 9, 2021

(54) SEMICONDUCTOR DEVICE

(71) Applicant: FUJI ELECTRIC CO., LTD., Kanagawa (JP)

(72) Inventors: Yoshihiro Yasuda, Matsumoto (JP); Takayuki Shimatou, Matsumoto (JP); Kenpei Nakamura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/228,812

(22) Filed: Dec. 21, 2018

(65) Prior Publication Data

US 2019/0252302 A1    Aug. 15, 2019

(30) Foreign Application Priority Data

Feb. 14, 2018   (JP) .................................. 2018-024546

(51) Int. Cl.
 *H01L 23/495*    (2006.01)
 *H01L 23/00*     (2006.01)

(52) U.S. Cl.
 CPC .. *H01L 23/49541* (2013.01); *H01L 23/49562* (2013.01); *H01L 24/49* (2013.01); *H01L 23/49548* (2013.01); *H01L 24/05* (2013.01); *H01L 24/06* (2013.01); *H01L 24/32* (2013.01); *H01L 24/45* (2013.01); *H01L 24/48* (2013.01); *H01L 24/73* (2013.01); *H01L 24/92* (2013.01); *H01L 24/97* (2013.01); *H01L 2224/05553* (2013.01); *H01L 2224/05554* (2013.01);

(Continued)

(58) Field of Classification Search
 CPC ......... H01L 23/49541; H01L 23/49562; H01L 23/49548; H01L 24/49; H01L 24/05; H01L 24/06; H01L 24/32; H01L 24/45; H01L 24/48; H01L 24/73; H01L 24/92; H01L 24/97
 See application file for complete search history.

(56) References Cited

U.S. PATENT DOCUMENTS

2008/0237627 A1* 10/2008 Kobayakawa ........ H01L 33/486
  257/99
2014/0008695 A1*  1/2014 Kobayakawa .......... H01L 33/60
  257/99

(Continued)

FOREIGN PATENT DOCUMENTS

JP  H11121680 A   4/1999
JP  2006216993 A  8/2006

(Continued)

*Primary Examiner* — Christine A Enad

(57) ABSTRACT

Provided is a semiconductor device including a semiconductor chip; a frame member having a chip placement surface on which the semiconductor chip is provided; and a first suspension lead and a second suspension lead connected to the frame member and provided on any side of the frame member, wherein M1≤L1+L2 is satisfied, where L1 is a distance from an arrangement position of the first suspension lead to a corner of the chip placement surface close to the first suspension lead, L2 is a distance from an arrangement position of the second suspension lead to a corner of the chip placement surface close to the second suspension lead, and M1 is a distance from the arrangement position of the first suspension lead to the arrangement position of the second suspension lead.

10 Claims, 7 Drawing Sheets

(52) U.S. Cl.
CPC ......... *H01L 2224/0603* (2013.01); *H01L 2224/45124* (2013.01); *H01L 2224/45139* (2013.01); *H01L 2224/45144* (2013.01); *H01L 2224/45147* (2013.01); *H01L 2224/48247* (2013.01); *H01L 2224/49111* (2013.01); *H01L 2224/49112* (2013.01); *H01L 2224/73265* (2013.01); *H01L 2224/92247* (2013.01); *H01L 2924/181* (2013.01); *H01L 2924/18301* (2013.01)

(56) References Cited

U.S. PATENT DOCUMENTS

| | | | |
|---|---|---|---|
| 2017/0213782 A1* | 7/2017 | Iwai | H01L 23/3121 |
| 2017/0213788 A1 | 7/2017 | Shimanuki | |
| 2019/0088632 A1* | 3/2019 | Tsukiyama | H01L 23/49541 |
| 2019/0221506 A1* | 7/2019 | Yeo | H01L 21/4825 |
| 2020/0176400 A1* | 6/2020 | Chikamatsu | H01L 23/4951 |

FOREIGN PATENT DOCUMENTS

| | | |
|---|---|---|
| JP | 2010147162 A | 7/2010 |
| JP | 2013044524 A | 3/2013 |
| JP | 2017135230 A | 8/2017 |

\* cited by examiner

SEMICONDUCTOR DEVICE

The contents of the following Japanese patent application(s) are incorporated herein by reference:
No. 2018-024546 filed in JP on Feb. 14, 2018.

BACKGROUND

1. Technical Field

The present invention relates to a semiconductor device.

2. Related Art

A semiconductor device for which resin sealing is performed after a semiconductor chip and a lead frame are connected with a connection members such as a wire has been known in the prior art (for example, see Patent document 1).

Patent document 1: Japanese Patent Application Publication No. 2010-147162

SUMMARY

It is preferable that occurrence of cracks in a semiconductor device be suppressed.

According to the first aspect of the present invention, provided is a semiconductor device including a semiconductor chip; a frame member having a chip placement surface on which the semiconductor chip is provided; and a first suspension lead and a second suspension lead connected to the frame member and provided on any side of the frame member, wherein $M1 \leq L1+L2$ is satisfied, where $L1$ is a distance from an arrangement position of the first suspension lead to a corner of the chip placement surface close to the first suspension lead, $L2$ is a distance from an arrangement position of the second suspension lead to a corner of the chip placement surface close to the second suspension lead, and $M1$ is a distance from the arrangement position of the first suspension lead to the arrangement position of the second suspension lead.

The semiconductor device may further include a sealing portion covering the semiconductor chip and at least a part of the frame member. The frame member may have an exposed surface exposed from the sealing portion. For the semiconductor device, $M1 \leq L1'+L2'$ may be satisfied, where $L1'$ is a distance from the arrangement position of the first suspension lead to a corner of the exposed surface close to the first suspension lead, and $L2'$ is a distance from the arrangement position of the second suspension lead to a corner of the exposed surface close to the second suspension lead.

The semiconductor device may further include a third suspension lead and a fourth suspension lead provided on a side of the frame member different from the side on which the first suspension lead and the second suspension lead are provided. For the semiconductor device, $M2 \leq L3+L4$ may be satisfied, wherein $L3$ is a distance from an arrangement position of the third suspension lead to a corner of the chip placement surface close to the third suspension lead, $L4$ is a distance from an arrangement position of the fourth suspension lead to a corner of the chip placement surface close to the fourth suspension lead, and $M2$ is a distance from the arrangement position of the third suspension lead to the arrangement position of the fourth suspension lead.

The distance $L1$ and the distance $L2$ may each be larger than or equal to $(M1+L1+L2) \times 0.2$.

The distance $L1$ may be equal to the distance $L2$.

At least a part of the first suspension lead and the second suspension lead may be provided to face the semiconductor chip.

The frame member may have a placement portion on which the semiconductor chip is placed and a terminal portion electrically connected to the semiconductor chip and configured to provide electrical connection to an outside of the semiconductor device. The first suspension lead may be provided to be more distant from the terminal portion than the second suspension lead, and $L1<L2$ may be satisfied.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1A:
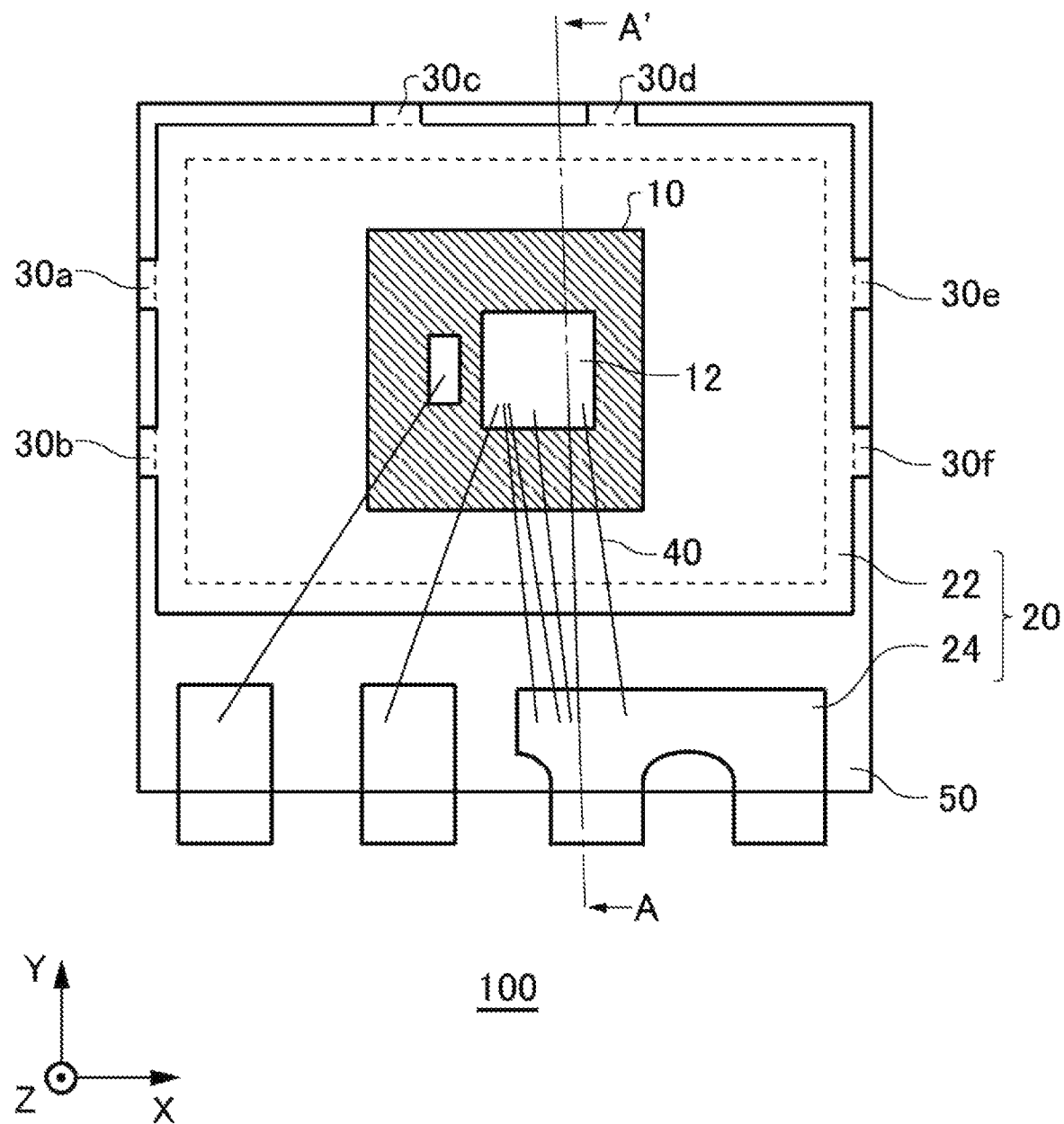
FIG. 1A illustrates one example of a configuration of a semiconductor device 100 according to example embodiment 1.

FIG. 1A illustrates one example of a configuration of a semiconductor device 100 according to example embodiment 1. The semiconductor device 100 in the present example includes a semiconductor chip 10, a frame member 20, suspension leads 30, connection members 40, and a sealing portion 50.

The semiconductor chip 10 is a semiconductor chip in which an insulated gate bipolar transistor (IGBT), an MOSFET, a diode, or the like to name a few, is formed. In the present example, directions orthogonal to each other on a plane parallel to the principal surface of the semiconductor chip 10 are an X-axis direction and a Y-axis direction, and a direction orthogonal to the principal surface of the semiconductor chip 10 is a Z-axis direction. The principal surface of the semiconductor chip 10 refers to the surface of the surfaces of the semiconductor chip 10 that has the largest area. In the present example, the principal surface of the semiconductor chip 10 refers to a lower surface facing the frame member 20 and an upper surface opposite to the lower surface. Note that directions such as upward and downward directions herein refer to relative directions, and are not necessarily identical to upward and downward directions of the gravity direction or to upward and downward directions when the semiconductor device 100 is mounted.

The semiconductor chip 10 is fixed onto the upper surface of the frame member 20 with solder or the like. The semiconductor chip 10 may be provided with an electrode electrically connected to the frame member 20. The semiconductor chip 10 has a pad portion 12 provided on the upper surface thereof.

The pad portion 12 is formed of a conductive material such as copper, aluminum, or other metal. For instance, the pad portion 12 is formed of AlSiCu or AlCu. Since the pad portion 12 contains copper, the hardness of the pad portion 12 can be improved. The pad portion 12 may have a uniform material composition, or have multiple layers having different material compositions which are stacked. Any layer of the pad portion 12 may be a plated layer. The lower surface of the pad portion 12 is electrically connected to an element such as a transistor or a diode formed in the semiconductor chip 10.

The frame member 20 has a placement portion 22 and a terminal portion 24. The frame member 20 is formed of a conductive material such as copper or other metal. The placement portion 22 and the terminal portion 24 may be formed of the same material.

The placement portion 22 is a member of the frame member 20 on which the semiconductor chip 10 is provided. The placement portion 22 has the principal surface having a size sufficient for the semiconductor chip 10 to be placed thereon. The semiconductor chip 10 is placed on the principal surface of the placement portion 22 via solder or the like. The placement portion 22 in the present example is provided to be separated from the terminal portion 24 by separating it from the lead frame.

The terminal portion 24 is a terminal for electrically connecting the semiconductor chip 10 to the outside of the semiconductor device 100. The terminal portion 24 is electrically connected to the semiconductor chip 10. At least a part of the terminal portion 24 is exposed from the sealing portion 50. For example, the terminal portion 24 is exposed from the sealing portion 50 in the X-Y and Y-Z cross sections as well as in the X-Z cross section in which the terminal portion 24 is provided. In this way, the terminal portion 24 is electrically connected to the outside of the semiconductor device 100. The areas of the terminal portion 24 where it is exposed in the X-Y cross section and the Y-Z cross section may be larger than the area exposed in the X-Z cross section. The terminal portion 24 is formed of a conductive material such as copper or other metal. The terminal portion 24 may be formed of the same material as the placement portion 22.

The suspension leads 30 are connected to the frame member 20. The suspension leads 30 and the frame member 20 may be integrally formed of the same material. The suspension leads 30 are each provided on any side of the frame member 20. The suspension leads 30 fix the frame member 20 and prevent the frame member 20 from coming off a jig during steps before singulation of the semiconductor device 100. The singulation of the semiconductor device 100 causes the suspension leads 30 to be exposed from the sealing portion 50. A surface of each suspension lead 30 may be exposed in only any one of the cross sections of the semiconductor device 100.

The suspension leads 30 in the present example include six suspension leads, suspension leads 30a-30f. The suspension leads 30a-30f are one example of a first suspension lead to a sixth suspension lead. The suspension leads 30a-30f are each arranged on any position on the periphery of the frame member 20. The suspension leads 30 are preferably provided apart from the location of the semiconductor device 100 where stresses are concentrated. Although the suspension leads 30a-30f in the present example have the same shape, they may have different shapes.

The suspension lead 30a and the suspension lead 30b are provided in the Y-Z cross section of the frame member 20. In the Y-Z cross section, the surfaces of the suspension lead 30a and the suspension lead 30b on the negative side of the X-axis direction are exposed from the sealing portion 50.

The suspension lead 30c and the suspension lead 30d are provided on a side of the frame member 20 different from the side on which the suspension lead 30a and the suspension lead 30b are provided. The suspension lead 30c and the suspension lead 30d are provided in the X-Z cross section of the frame member 20. The surfaces of the suspension lead 30c and the suspension lead 30d on the positive side of the Y-axis direction are exposed from the sealing portion 50.

The suspension lead 30e and the suspension lead 30f are provided on a side of the frame member 20 different from the side on which the suspension leads 30a-30d are provided. The suspension lead 30e and the suspension lead 30f are provided in the Y-Z cross section of the frame member 20. The surfaces of the suspension lead 30e and the suspension lead 30f on the positive side of the X-axis direction are exposed from the sealing portion 50. In the present example, the suspension leads 30e and 30f are symmetrical to the suspension leads 30a and 30b about any Y-Z plane. Not that in the present example, the suspension leads 30e and 30f and the suspension leads 30a and 30b may be arranged asymmetrically about any Y-Z plane.

In the present example, a plurality of suspension leads 30 is provided on each of three sides of the frame member 20. This makes it easier to fix the frame member 20 to a lead frame during steps before singulation of the semiconductor device 100.

The connection members 40 contain at least one of copper or silver as a material. The connection members 40 electrically connect the placement portion 22 and the terminal portion 24. The connection members 40 in the present example are wires, one end portion of each wire being connected to the placement portion 22 and another to the terminal portion 24. The connection members 40 are connected to the semiconductor chip 10 on the placement portion 22 via the pad portion 12. The connection members 40 may be copper wires, silver wires, or alloy wires containing copper or silver. Note that the connection members 40 are not limited to the present example and may be gold wires or aluminum wires.

For example, the terminal portion 24 is connected to an emitter electrode (or a source electrode) or the like of the semiconductor chip 10. Also, the terminal portion 24 may be connected to a gate electrode or the like of the semiconductor chip 10. The terminal portion 24 may be connected to an electrode for sensing current, an electrode for sensing temperature, or the like of the semiconductor chip 10, or may be connected to an electrode of a control circuit provided to the semiconductor chip 10. On the other hand, the placement portion 22 may be connected to a collector electrode (or a drain electrode) or the like of the semiconductor chip 10 via solder or the like.

The sealing portion 50 covers the entire semiconductor chip 10. The sealing portion 50 covers at least a part of the frame member 20. The sealing portion 50 is formed of resin or the like, and seals the semiconductor chip 10, the frame member 20, and the connection members 40. The sealing portion 50 in the present example contains a base compound (for example, epoxy resin), a curing agent (for example, phenol resin), an inorganic filler, and a silane coupling agent. In addition, the sealing portion 50 may also contain a mold release agent, an adhesion imparting agent, a curing catalyst, a pigment, a flame retardant, a low stress agent, or an ion-trapping agent. The semiconductor chip 10 and the connection members 40 may be entirely sealed in the sealing portion 50.

Figure 1B:
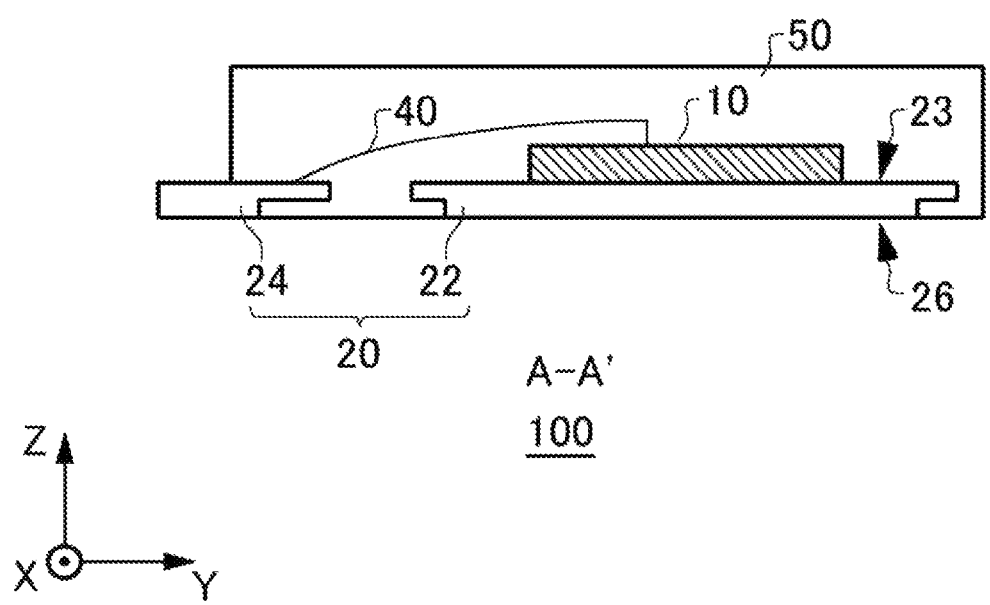
FIG. 1B illustrates a cross section taken along A-A' in the semiconductor device 100 according to FIG. 1A.

FIG. 1B illustrates a cross section taken along A-A' in the semiconductor device 100 according to FIG. 1A. The A-A' cross section is a cross section the principal section of which is the Y-Z cross section of the semiconductor device 100, and corresponds to a cross section along the alternate long and short dash line of A-A' in FIG. 1A. The semiconductor device 100 is provided on the chip placement surface 23 of the frame member 20.

The chip placement surface 23 is a plane of the placement portion 22 on which the semiconductor device 100 is placed. The chip placement surface 23 in the present example is a surface of the frame member 20 on the positive side of the Z-axis direction. The chip placement surface 23 may be electrically connected to the semiconductor chip 10 via a conductive member such as solder.

At least a part of the terminal portion 24 is exposed from the sealing portion 50. The terminal portion 24 may be electrically connected to the semiconductor chip 10 via connection members 40 in the area sealed in the sealing portion 50. Also, the terminal portion 24 may be electrically connected to the outside of the semiconductor device 100 in the area exposed from the sealing portion 50.

The exposed surface 26 is a surface of the frame member 20 that is exposed from the sealing portion 50. The exposed surface 26 in the present example is a surface of the frame member 20 on the negative side in the Z-axis direction. The semiconductor device 100 in the present example has a back-surface fin exposure structure. For the structure, a part of the frame member 20 is exposed on the back surface thereof.

For the back-surface fin exposure structure, stresses tend to be concentrated more in the sealing portion 50 than for a full mold product in which the sealing portion 50 entirely covers the back surface side of the frame member. Also, the package thickness of the semiconductor device 100 having the back-surface fin exposure structure is thinner, which may result in large curvature deformation due to the differences in linear expansion coefficient among the respective members. Therefore, cracks may be more likely to occur in a product using the back-surface fin exposure structure than in a full mold product. Particularly, the stresses tend to be concentrated at the corners of the sealing portion 50, which could lead to development of cracks at the interface between the sealing portion 50 and the suspension lead 30.

Even if the semiconductor device 100 in the present example has a back-surface fin exposure structure, occurrence of cracks can be suppressed by adjusting an arrangement of the suspension leads 30. Since the stresses are likely to be concentrated at the corners of the sealing portion 50, cracks tend to develop if the suspension leads 30 are provided near the corners of the sealing portion 50. In the present example, the occurrence of the cracks after reflow or a temperature stress test can be suppressed by providing the suspension leads 30 at positions other than the corners of the sealing portion 50.

Figure 2:
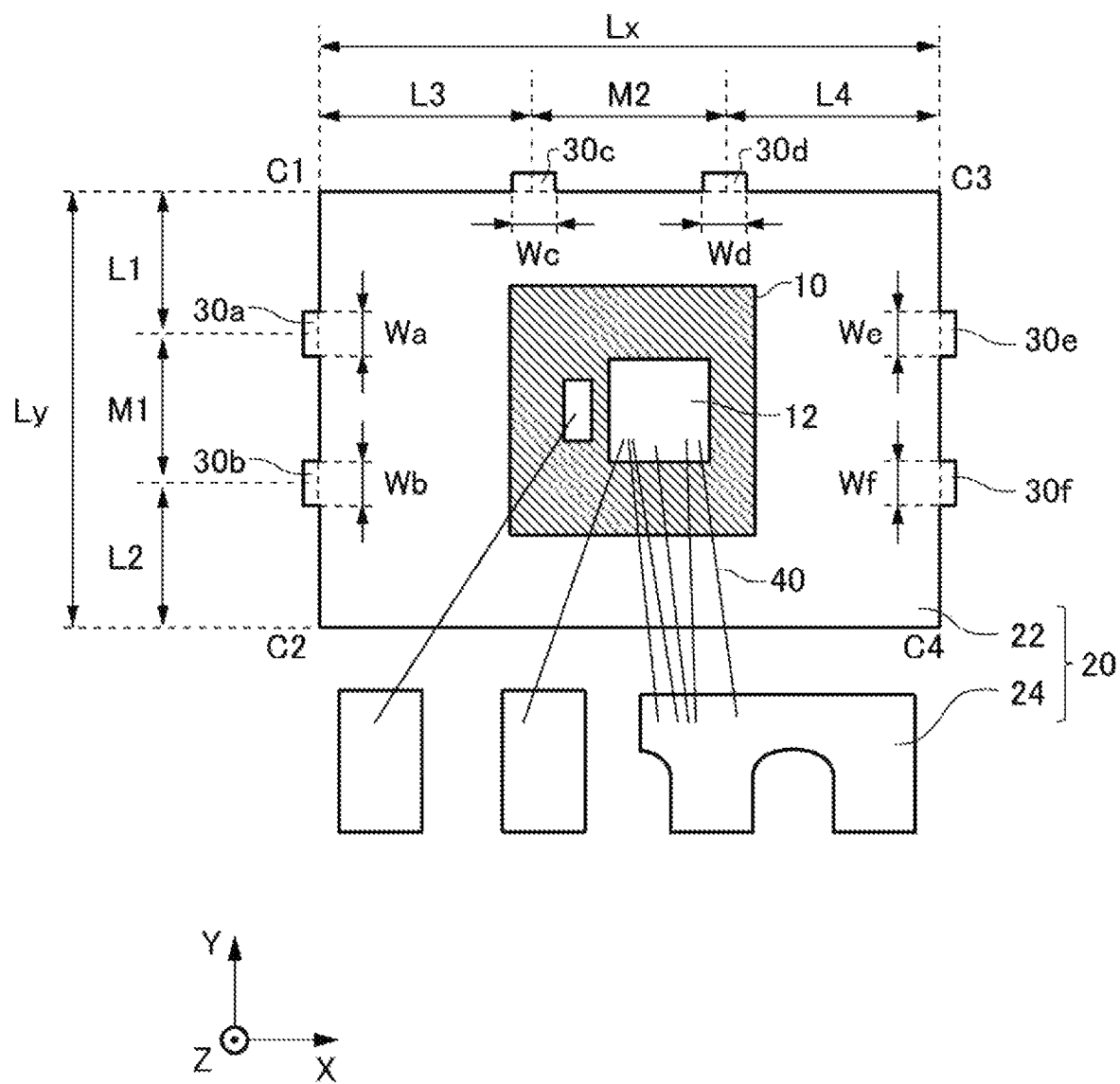
FIG. 2 is a diagram for describing one example of an arrangement manner of suspension leads 30.

FIG. 2 is a diagram for describing one example of an arrangement manner of the suspension leads 30. In the figure, some members of the semiconductor device 100 are extracted and illustrated to describe the dimensions of the frame member 20 and the arrangement of the suspension leads 30. Corners C1-C4 correspond to four corners of the placement portion 22, respectively.

A distance L1 is a distance from the arrangement position of the suspension lead 30a to the corner C1 of the chip placement surface 23 close to the suspension lead 30a. The arrangement position of the suspension lead 30a refers to a center position of the suspension lead 30a in the Y-axis direction. The distance L1 is preferably large enough that the cracks can be suppressed.

A distance L2 is a distance from the arrangement position of the suspension lead 30b to the corner C2 of the chip placement surface 23 close to the suspension lead 30b. The arrangement position of the suspension lead 30b refers to a center position of the suspension lead 30b in the Y-axis direction. The distance L2 is preferably large enough that the cracks can be suppressed.

A distance M1 is a distance from the arrangement position of the suspension lead 30a to the arrangement position of the suspension lead 30b. The distance from the suspension lead 30a to the suspension lead 30b refers to the distance between the center of the suspension lead 30a in the Y-axis direction and the center of the suspension lead 30b in the Y-axis direction. The sum of the distance L1, the distance L2, and the distance M1, (L1+L2+M1), is equal to the length of the side of the frame member 20 in which the suspension lead 30a and the suspension lead 30b are provided, Ly.

Increasing the distance M1 makes it easier to fix the frame member 20 to a lead frame during steps before singulation of the semiconductor device 100. However, if the distance M1 is too large, sufficient distance L1 and distance L2 cannot be secured. For this reason, the distance M1 may be set to a small value within the range capable of fixing the frame member 20 to a lead frame during steps before singulation of the semiconductor device 100. This can make the distance L1 and the distance L2 sufficiently large.

A width W refers to the width in the direction in which the side of the frame member 20 on which the suspension leads 30 are provided extends. For example, the width Wa, the width Wb, the width Wc, and the width Wf correspond to the widths of the suspension lead 30a, the suspension lead 30b, the suspension lead 30e, and the suspension lead 30f in the Y-axis direction, respectively since the corresponding suspension leads 30 are provided on the sides of the frame member 20 that extend in the Y-axis direction. Also, the width Wc and the width Wd correspond to the widths of the suspension lead 30c and the suspension lead 30d in the X-axis direction, respectively since the corresponding suspension leads 30 are provided on the side of the frame member 20 that extends in the X-axis direction.

The width W needs to be large enough that the frame member 20 can be fixed to a lead frame during steps before singulation of the semiconductor device 100. The width Wa, the width Wb, the width We, and the width Wf may be smaller than or equal to 15%, smaller than or equal to 10%, or smaller than or equal to 5% of the length of the side of the frame member 20, Ly. Also, the width Wc and the width Wd may be smaller than or equal to 15%, smaller than or equal to 10%, or smaller than or equal to 5% of the length of the side of the frame member 20, Lx.

Also, the width W may be smaller than or equal to the width of the terminal portion 24 in the X-axis direction. If a plurality of terminal portions 24 is provided, the width of the terminal portion 24 in the X-axis direction refers to the width of the terminal portion 24 in the X-axis direction which has the smallest width in the X-axis direction. The width W may be larger than or equal to the board thickness of the frame member 20. The width W may be smaller than or equal to the width of the terminal portion 24 in the X-axis direction and larger than or equal to the board thickness of the frame member 20.

The suspension lead 30a and the suspension lead 30b are preferably provided apart from four corners of the frame member 20. In other words, it is preferable that on the side of the frame member 20, the suspension lead 30a and the suspension lead 30b not be provided near the corners C but near the center of the side on which the suspension lead 30a and the suspension lead 30b are provided. For example, the suspension lead 30a and the suspension lead 30b are arranged such that M1≤L1+L2 is satisfied. This reduces the occurrence of cracks around the suspension leads 30 in the package.

Also, at least a part of the suspension lead 30a and the suspension lead 30b is provided to face the semiconductor chip 10. Although the suspension leads 30 in the present example are provided to face the semiconductor chip 10 in whole, they may be provided to face the semiconductor chip 10 in part. For example, when the suspension lead 30 having a width W in the Y-axis direction is provided to face the semiconductor chip 10, the position of the suspension lead 30 in the Y-axis direction overlaps the position of the semiconductor chip 10 in the Y-axis direction. Also, when the suspension lead 30 having a width W in the X-axis direction is provided to face the semiconductor chip 10, the position of the suspension lead 30 in the X-axis direction overlaps the position of the semiconductor chip 10 in the X-axis direction.

A distance L3 is a distance from the suspension lead 30c to the corner C1 on the chip placement surface 23 close to the suspension lead 30c. The distance from the suspension lead 30c to the corner C1 refers to the distance from the center of the suspension lead 30c in the X-axis direction to the corner C1. The distance L3 is preferably large enough that cracks can be suppressed.

The distance L4 is a distance from the suspension lead 30d to the corner C3 of the chip placement surface 23 close to the suspension lead 30d. The distance from the suspension lead 30d to the corner C3 refers to the distance from the center of the suspension lead 30d in the X-axis direction to the corner C3. The distance L4 is preferably large enough that cracks can be suppressed.

The distance M2 is a distance from the suspension lead 30c to the suspension lead 30d. The distance from the suspension lead 30c to the suspension lead 30d refers to the distance between the center of the suspension lead 30c in the X-axis direction and the center of the suspension lead 30d in the X-axis direction. The sum of the distance L3, the distance L4, and the distance M2, (L3+L4+M2) is equal to the length of the side of the frame member 20 in which the suspension lead 30c and the suspension lead 30d are provided, Lx.

Increasing the distance M2 makes it easier to fix the frame member 20 to a lead frame during steps before singulation of the semiconductor device 100. However, if the distance M2 is too large, sufficient distance L3 and distance L4 cannot be secured. For this reason, the distance M2 may be set to a small value, provided that it is within the range capable of fixing the frame member 20 to a lead frame during steps before singulation of the semiconductor device 100. This can make distance L3 and the distance L4 sufficiently large.

It is preferable that on the side of the frame member 20, the suspension lead 30c and the suspension lead 30d not be provided near the corners C but near the center of the side on which the suspension lead 30c and the suspension lead 30d are provided. For example, the suspension lead 30c and the suspension lead 30d are arranged such that M2≤L3+L4 is satisfied.

Each suspension lead 30 is preferably provided, on its corresponding side of the frame member 20, inwardly from the corner of the side by more than or equal to 20% of the side. For example, the distance L1 and the distance L2 each satisfy the value larger than or equal to (M1+L1+L2)×0.2. Similarly, the distance L3 and the distance L4 may each satisfy the value larger than or equal to (M2+L3+L4)×0.2.

The suspension lead 30a and the suspension lead 30b are arranged such that the distance L1 is equal to the distance L2. Note that the suspension lead 30a and the suspension lead 30b may be arranged such that the distance L1 is not equal to the distance L2. Also, the suspension lead 30c and the suspension lead 30d are arranged such that the distance L3 is equal to the distance L4. Note that the suspension lead 30c and the suspension lead 30d may be arranged such that the distance L3 is not equal to the distance L4.

In the present example, a plurality of suspension leads 30 is provided on one side of the frame member 20, and they are provided apart from the four corners of the frame member 20. In this way, cracks can be suppressed while the suspension leads 30 prevent the frame member 20 from wobbling during steps before singulation.

Figure 3:
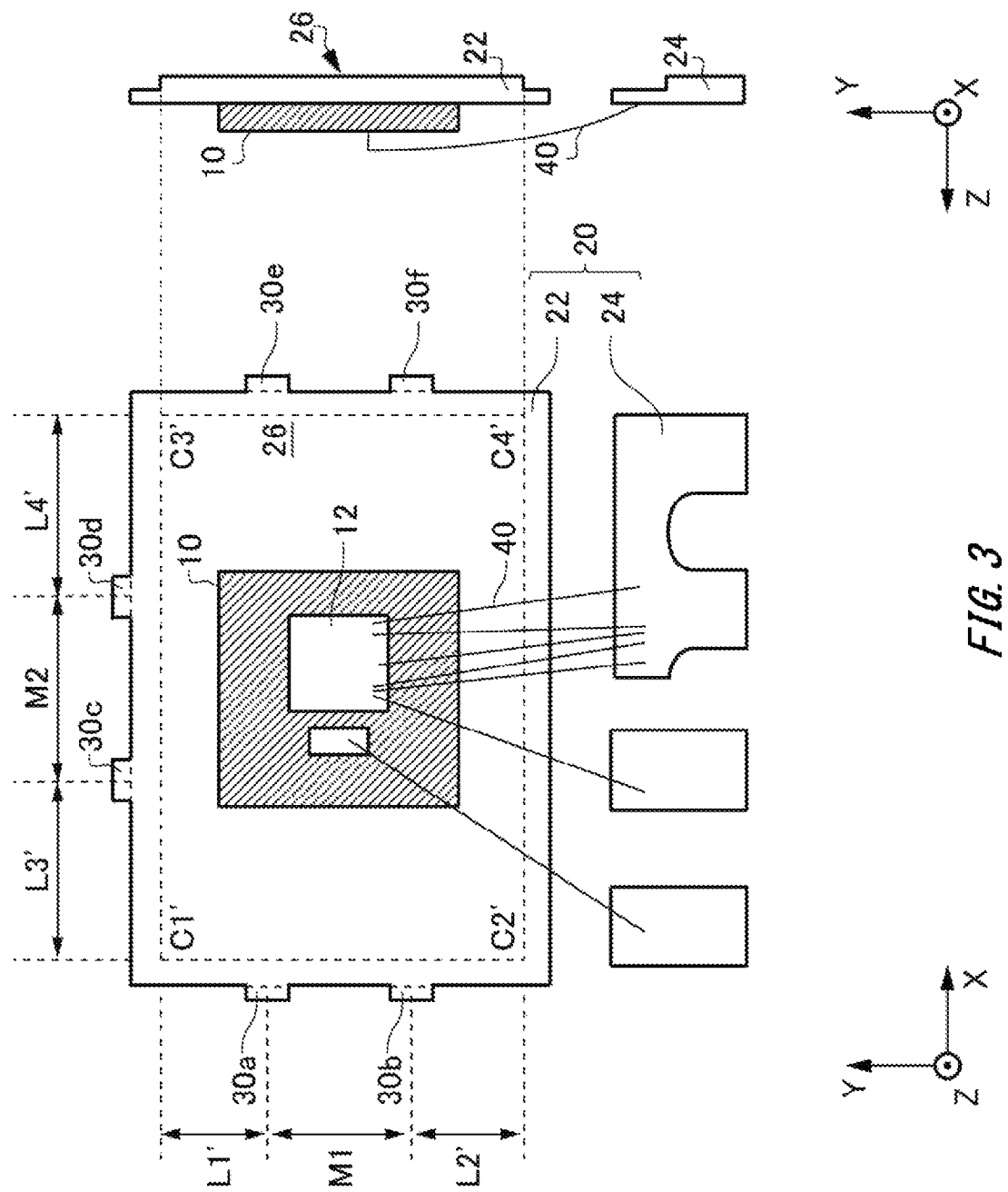
FIG. 3 is a diagram for describing one example of an arrangement manner of the suspension lead 30.

FIG. 3 is a diagram for describing one example of an arrangement manner of the suspension leads 30. In the figure, some members of the semiconductor device 100 are extracted and illustrated to describe the dimensions of the frame member 20 and the arrangement of the suspension leads 30. Corners C1' to C4' correspond to four corners of the exposed surface 26, respectively.

A distance L1' is a distance from the arrangement position of the suspension lead 30a to the corner C1' of the exposed surface 26 close to the suspension lead 30a. The distance L1' is different from the distance L1 in that it is measured from the corner C1' of the exposed surface 26. The suspension lead 30a is preferably arranged apart from the corner C1' by increasing the distance L1' in order to suppress cracks.

A distance L2' is a distance from the arrangement position of the suspension lead 30b to the corner C2' of the exposed surface 26 close to the suspension lead 30b. The distance L2' is different from the distance L2 in that it is measured from the corner C2' of the exposed surface 26. The suspension lead 30b is preferably arranged apart from the corner C2' by increasing the distance L2' in order to suppress cracks.

A distance L3' is a distance from the arrangement position of the suspension lead 30c to the corner C1' of the exposed surface 26 close to the suspension lead 30c. The distance L3' is different from the distance L3 in that it is measured from the corner C1' of the exposed surface 26. The suspension lead 30c is preferably arranged apart from the corner C1' by increasing the distance L3' in order to suppress cracks.

A distance L4' is a distance from the arrangement position of the suspension lead 30d to the corner C3' of the exposed surface 26 close to the suspension lead 30d The distance L4' is different from the distance L4 in that it is measured from the corner C3' of the exposed surface 26. The suspension lead 30d is preferably arranged apart from the corner C3' by increasing the distance L4' in order to suppress cracks.

Note that the distance M1 and the distance M2 are the same as the distance M1 and the distance M2 illustrates in FIG. 2. The distance M1 and the distance M2 are adjusted with the lengths of the distances L1'-L4' taken into consideration in terms of suppression of cracks and fixation of the frame member 20.

It is preferable that on the side of the exposed surface 26, the suspension lead 30a and the suspension lead 30b not be provided near the corners C' but near the center of the side on which the suspension lead 30a and the suspension lead 30b are provided. For example, the suspension lead 30a and the suspension lead 30b are arranged such that M1≤L1'+L2' is satisfied. Similarly, the suspension lead 30c and the suspension lead 30d may be arranged such that M1≤L3'+L4' is satisfied.

Each suspension lead 30 is preferably provided, on its corresponding side of the exposed surface 26, inwardly from the corner of the side by more than or equal to 20% of the side. For example, the distance L1' and the distance L2' each satisfy the value larger than or equal to (M1+L1'+L2')×0.2. Similarly, the distance L3' and the distance L4' may each satisfy the value larger than or equal to (M2+L3'+L4')×0.2.

Figure 4:
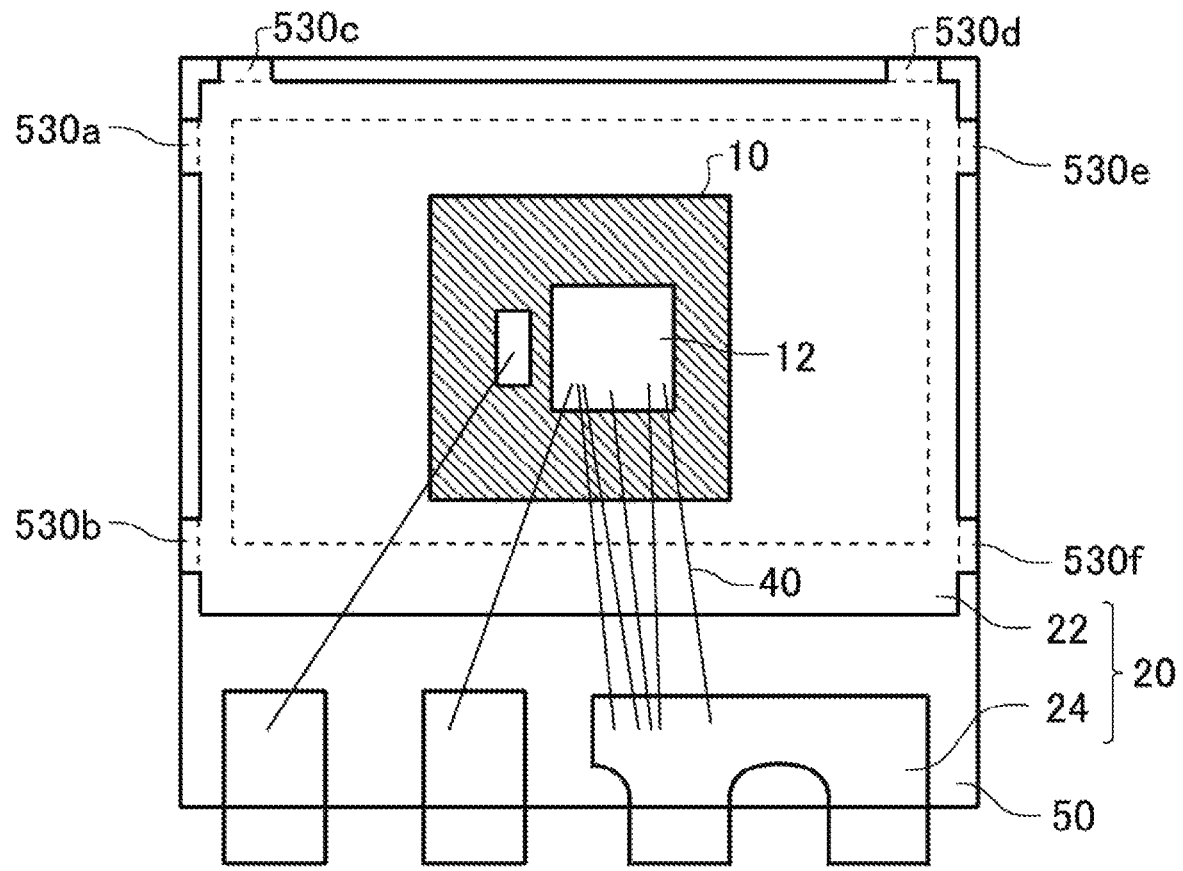
FIG. 4 illustrates a semiconductor device 500 according to a comparative example.

FIG. 4 illustrates a semiconductor device 500 according to a comparative example. For the semiconductor device 500, the positions at which suspension leads 530 are provided are different from those for the semiconductor device 100. The suspension leads 530 are provided near the four corners of the frame member 20 in order to fix the frame member 20. Therefore, for the semiconductor device 500, occurrence of cracks after reflow or a temperature stress test cannot be suppressed.

Also, the suspension leads 530 are provided such that they do not face the semiconductor chip 10. The sealing portion 50 of the semiconductor device 500 needs to be formed of a material having high elasticity and a high glass-transition temperature Tg in order to suppress occurrence of cracks. Therefore, it is difficult to suppress the cost of the semiconductor device 500.

Figure 5:
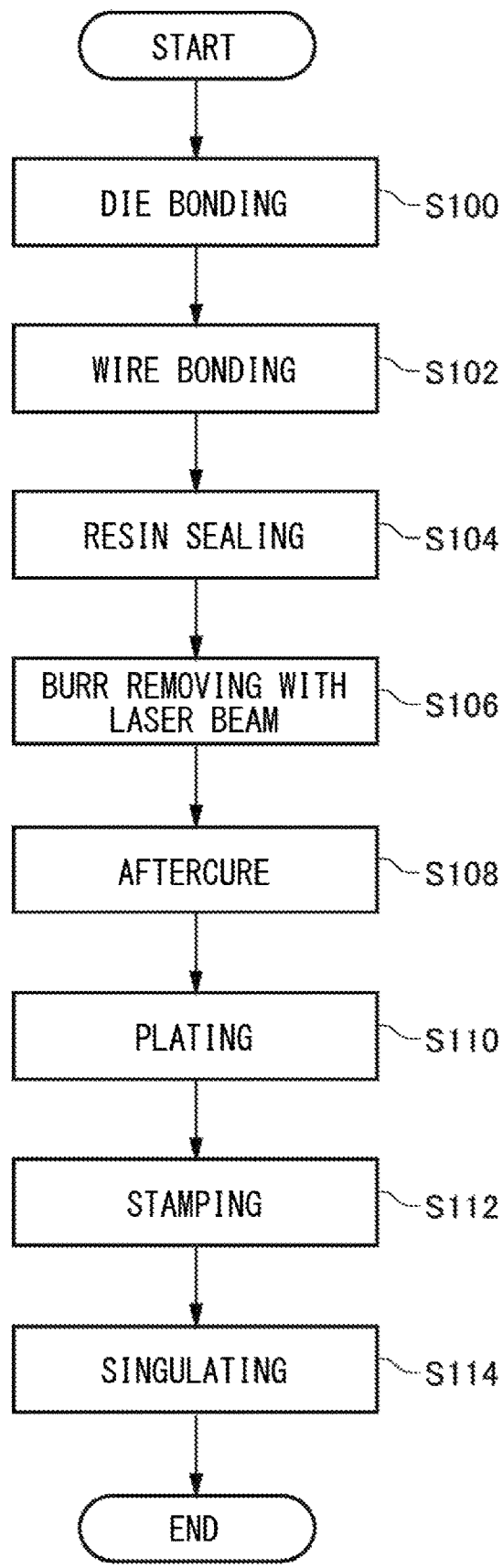
FIG. 5 is one example of an operation flow for manufacturing the semiconductor device 100.

FIG. 5 is one example of an operation flow for manufacturing the semiconductor device 100. The operation flow in the present example includes steps S100-S114.

A lead frame for configuration of the frame member 20 and the suspension leads 30 is prepared. The frame member 20 and the suspension leads 30 may be formed by performing etching processing or press processing on the lead frame. The frame member 20 and the suspension leads 30 may have higher hardness than the pad portion 12. Since the frame member 20 and the suspension leads 30 are not directly connected to the semiconductor material and the like, the material can be selected relatively freely. Then, the semiconductor chip 10 is die-bonded on the lead frame (S100).

Then, the connection members 40 are wire-bonded in order to electrically connect the semiconductor chip 10 to the terminal portion 24 (S102). Reliability under the condition that high temperature is applied can be improved compared with wires of aluminum or gold by forming such that the connection members 40 contain at least one of copper and silver. For example, although the semiconductor device 100 for vehicles may be exposed to a high surrounding temperature, the reliability can be improved in such usage.

The semiconductor chip 10 is sealed in the sealing portion 50 (S104). Burrs of the sealing portion 50 are removed with a laser beam (S106). After the sealing with the sealing portion 50, aftercure is performed on the semiconductor device 100 (S108). Plate processing is performed on the terminal portion 24 and the like of the semiconductor device 100 (S110). A product number, a lot number or the like is stamped on the semiconductor device 100 (S112). The semiconductor device 100 is singulated by cutting the lead frame (S114). Before the singulation of the semiconductor device 100, the placement portion 22 and the terminal portion 24 are connected to a common lead frame. Also, before the singulation of the semiconductor device 100, a plurality of semiconductor devices 100 may be connected to the common lead frame. Note that each suspension lead 30 in the present example may be a part of the suspension lead remaining at the semiconductor device 100 when the suspension lead is cut to perform the singulation at step S114.

Figure 6:
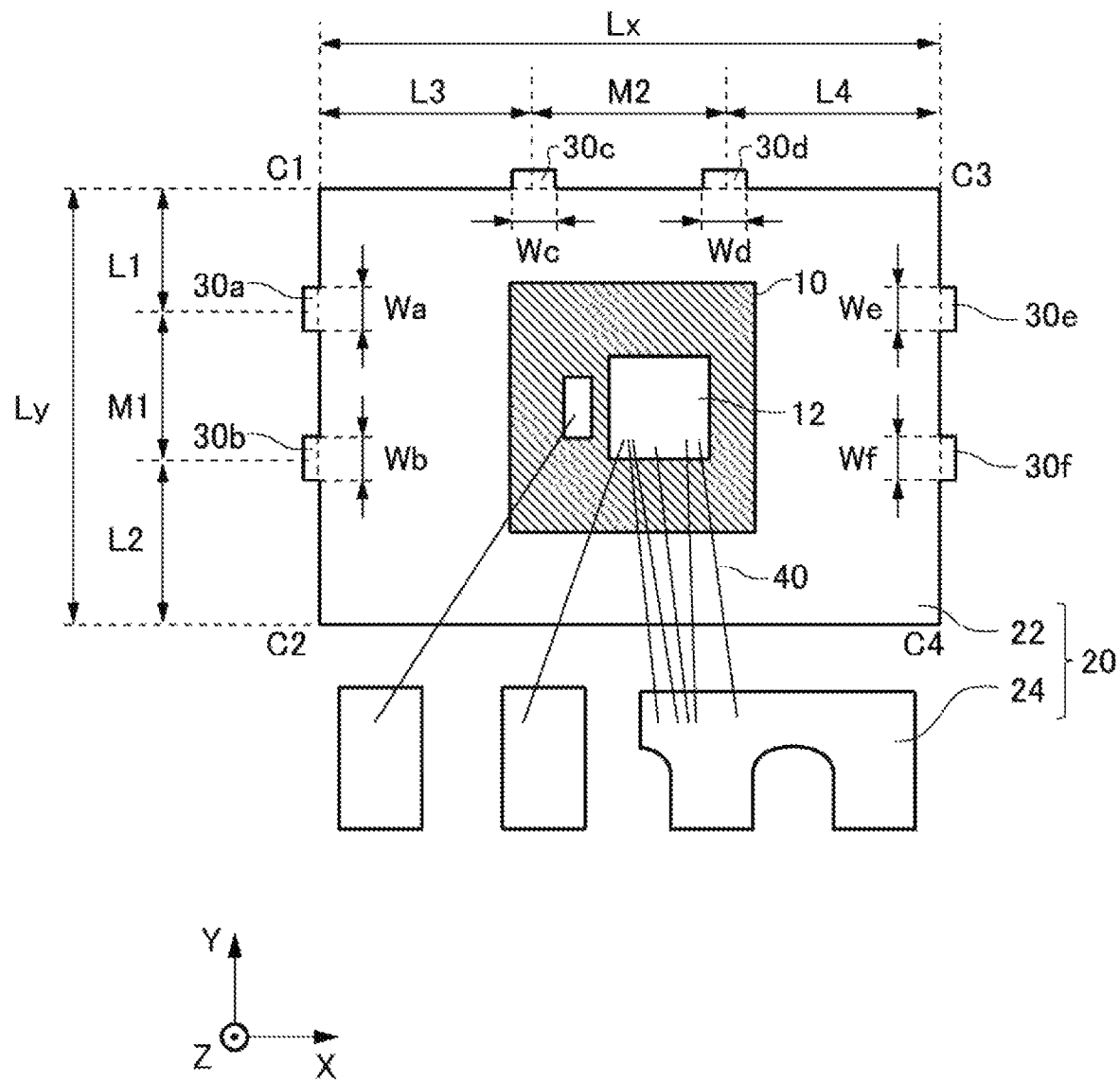
FIG. 6 illustrates one example of the configuration of the semiconductor device 100 according to example embodiment 2.

FIG. 6 illustrates one example of the configuration of the semiconductor device 100 according to example embodiment 2. The semiconductor device 100 in the present example is different from the semiconductor device 100 according to example embodiment 1 in that the length of the distance L1 is different from the length of the distance L2.

The suspension lead 30a and the suspension lead 30b are provided asymmetrically about the side of the frame member 20. For the suspension lead 30a and the suspension lead 30b in the present example, the suspension lead 30b is provided more inwardly than the suspension lead 30a on the side of the frame member 20. In other words, the suspension lead 30a and the suspension lead 30b is arranged such that L1<L2 is satisfied.

Here, the suspension lead 30a is the suspension lead 30 provided to be more distant from the terminal portion 24 than the suspension lead 30b. Cracks in the semiconductor device 100 are suppressed by making the suspension lead 30 arranged proximally to the terminal portion 24 closer to the center of the side of the frame member 20 than the suspension lead 30 arranged distally from the terminal portion 24 as in the present example. In other words, in the region proximal to the terminal portion 24, a pattern is more complicated than in the region distal from the terminal portion 24 and stresses tend to be concentrated during reflow. For this reason, the suspension lead 30 proximal to the terminal portion 24 is preferably provided far away from the corner of the frame member 20. In other words, the stress during reflow which originates in the center of the chip (Ly direction) tends to be concentrated at the corners of the frame member 20 in the region proximal to the terminal portion 24, and cracks are likely to occur in the sealing portion 50. For this reason, the suspension lead 30 proximal to the terminal portion 24 is preferably provided far away from the corner of the frame member 20.

Cracks in the package of the semiconductor device 100 caused by temperature change is suppressed by arranging the suspension leads 30 apart from the four corners of the frame member 20. Thus, the arrangement of the suspension leads 30 can be easily changed by changing a die-cut configuration of the frame member 20. Therefore, since the semiconductor device 100 does not require increase of elasticity of resin or increase of the glass-transition temperature Tg, cracks in the package can be suppressed without increasing cost.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor chip, 12: pad portion, 20: frame member, 22: placement portion, 23: chip placement surface, 24: terminal portion, 26: exposed surface, 30: suspension lead, 40: connection member, 50: sealing portion, 100: semiconductor device, 500: semiconductor device, 530: suspension lead

What is claimed is:

1. A semiconductor device, comprising:
a semiconductor chip;
a singular frame member having a chip placement surface on which the semiconductor chip is provided;
a first suspension lead and a second suspension lead connected to the singular frame member and provided on a first side of the singular frame member, the first suspension lead being a closest lead to a first corner of the chip placement surface on the first side of the singular frame member, the second suspension lead being a closest lead to a second corner of the chip placement surface on the first side of the singular frame member;
a third suspension lead and a fourth suspension lead connected to the singular frame member and provided on a second side of the singular frame member;
a fifth suspension lead and a sixth suspension lead connected to the singular frame member and provided on a third side of the singular frame member; and
a sealing resin covering the semiconductor chip on a first surface of the singular frame member, and which leaves exposed a second surface of the singular frame member, wherein
an end of the first suspension lead and an end of the second suspension lead being exposed in a side of the sealing resin, $M1 \leq L1+L2$ is satisfied, where
L1 is a distance between the first corner of the singular frame member and a center line of the first suspension lead that is closest to the first corner,
L2 is a distance between the second corner of the singular frame member and a center line of the second suspension lead that is closest to the second corner, and
M1 is a distance between the center line of the first suspension lead and the center line of the second suspension lead, and $L1 > Wa/2$ and $L2 > Wb/2$ are satisfied, where
Wa is a width of the first suspension lead in a direction of the first side, and
Wb is a width of the second suspension lead in a direction of the first side, wherein $M2 \leq L3+L4$ is satisfied, where
L3 is a distance between an arrangement position of the third suspension lead and a corner of the chip placement surface of the singular frame member closest to the third suspension lead,
L4 is a distance between an arrangement position of the fourth suspension lead and a corner of the chip placement surface of the singular frame member closest to the fourth suspension lead, and
M2 is a distance between the arrangement position of the third suspension lead and the arrangement position of the fourth suspension lead, and wherein $M3 \leq L5+L6$ is satisfied, where
L5 is a distance between an arrangement position of the fifth suspension lead and a corner of the chip placement surface of the singular frame member closest to the fifth suspension lead,
L6 is a distance between an arrangement position of the sixth suspension lead and a corner of the chip placement surface of the singular frame member closest to the sixth suspension lead, and
M3 is a distance between the arrangement position of the fifth suspension lead and the arrangement position of the sixth suspension lead.

2. The semiconductor device according to claim 1, wherein $M1 \leq L1'+L2'$ is satisfied, where
L1' is a distance between the arrangement position of the first suspension lead and a corner of the exposed second surface of the singular frame member closest to the first suspension lead, and
L2' is a distance between the arrangement position of the second suspension lead and a corner of the exposed second surface of the singular frame member closest to the second suspension lead.

3. The semiconductor device according to claim 1, wherein
the distance L1 and the distance L2 are each larger than or equal to $(M1+L1+L2) \times 0.2$.

4. The semiconductor device according to claim 1, wherein
the distance L1 is equal to the distance L2.

5. The semiconductor device according to claim 1, wherein
at least a part of the first suspension lead and the second suspension lead are provided to face the semiconductor chip.

6. The semiconductor device according to claim 1, wherein
the singular frame member includes:
a placement portion on which the semiconductor chip is placed; and
a terminal portion electrically connected to the semiconductor chip and configured to provide electrical connection to an outside of the semiconductor device, and
the first suspension lead is provided to be more distant from the terminal portion than the second suspension lead is, and $L1 < L2$ is satisfied.

7. The semiconductor device according to claim 1, wherein
the first suspension lead and the second suspension lead are exposed from the first side of the singular frame member;
the third suspension lead and the fourth suspension lead are exposed from the second side of the singular frame member; and
the fifth suspension lead and the sixth suspension lead are exposed from the third side of the singular frame member.

8. The semiconductor device according to claim 1, wherein
a rear surface of each of the first through sixth suspension leads are covered by the sealing resin.

9. The semiconductor device according to claim 1, wherein
the first suspension lead and the second suspension lead provided on the first side of the singular frame member, and the third suspension lead and the fourth suspension lead provided on the second side of the singular frame member, are symmetrically disposed on the singular frame member.

10. A semiconductor device, comprising:
a semiconductor chip;
a singular frame member having a chip placement surface on which the semiconductor chip is provided;
a first suspension lead and a second suspension lead connected to the singular frame member and each provided on each of a first, second and third side of the singular frame member, the first suspension lead being a closest lead to a first corner of the chip placement surface on the respective first, second or third side of the singular frame member, the second suspension lead being a closest lead to a second corner of the chip placement surface on the respective first, second or third side of the singular frame member; and
a sealing resin covering the semiconductor chip on a first surface of the singular frame member, and which leaves exposed a second surface of the singular frame member, wherein
an end of the first suspension lead and an end of the second suspension lead being exposed in a side of the sealing resin, $$M1 \leq L1 + L2 \text{ is satisfied,}$$

where
L1 is a distance between the first corner of the singular frame member and a center line of the first suspension lead that is closest to the first corner on each of the first, second and third sides of the singular frame member,
L2 is a distance between the second corner of the singular frame member and a center line of the second suspension lead that is closest to the second corner on each of the first, second and third sides of the singular frame member, and
M1 is a distance between the center line of the first suspension lead and the center line of the second suspension lead on each of the first, second and third sides of the singular frame member, and $$L1 > Wa/2 \text{ and } L2 > Wb/2 \text{ are satisfied,}$$

where
Wa is a width of the first suspension lead in a direction of each respective first, second and third sides, and
Wb is a width of the second suspension lead in a direction of each respective first, second and third sides.

* * * * *